US005554951A

United States Patent [19]

Gough

[11] Patent Number: 5,554,951
[45] Date of Patent: Sep. 10, 1996

[54] SIGNAL CONDITIONING APPARATUS AND METHOD EXHIBITING ACCURATE INPUT IMPEDANCE AND GAIN CHARACTERISTICS OVER COMMON MODE RANGE AND OPERATIONAL ENVIRONMENTS

[75] Inventor: John J. Gough, Beith Ayrshire, United Kingdom

[73] Assignee: National Semiconductor Corporation, Santa Clara, Calif.

[21] Appl. No.: 553,157

[22] Filed: Nov. 7, 1995

Related U.S. Application Data

[63] Continuation of Ser. No. 286,051, Aug. 4, 1994, abandoned.

[51] Int. Cl.$^6$ .................................................. G11C 27/02
[52] U.S. Cl. .............................. 327/337; 327/91; 327/95
[58] Field of Search ................................. 327/91–96, 337, 327/362, 554, 361, 336; 330/69

[56] References Cited

U.S. PATENT DOCUMENTS

| 4,214,563 | 7/1980 | Hosaka | 123/437 |
| 4,232,271 | 11/1980 | Dobkin et al. | 330/258 |
| 4,453,130 | 6/1984 | Bennett | 330/51 |
| 4,604,584 | 8/1986 | Kelley | 330/9 |
| 4,760,346 | 7/1988 | Kultgen et al. | 330/69 |

FOREIGN PATENT DOCUMENTS 2094946   10/1982   United Kingdom .

OTHER PUBLICATIONS

National Semiconductor Datasheet; "LM 1964 Sensor Interface Amplifier", pp. 7–72.

Primary Examiner—Timothy P. Callahan
Assistant Examiner—Jeffrey Zweizig
Attorney, Agent, or Firm—Skjerven, Morrill, MacPherson, Franklin & Friel; Kent B. Chambers

[57] ABSTRACT

A signal conditioning apparatus useful in applications, such as automotive applications, having a signal conditioning circuit capable of conditioning a sensor input signal and providing an output useful, for example, to a fuel-air mixture control system. The signal conditioning circuit employs an amplifier with a feedback impedance, NMOS and PMOS transistors, an input impedance, a detection impedance, input terminals coupled to a sensor. The sensor, such as an oxygen sensor, has a sensor output referenced to sensor ground and input terminals coupled to a power supply and power supply ground. The signal conditioning circuit utilizes switched impedances to provide an output voltage proportional to the differential voltage between the sensor output voltage and the sensor ground when an impedance between the signal conditioning circuit input terminals is low relative to the detection impedance. Otherwise the signal conditioning circuit utilizing switched impedances provides an output voltage proportional to the power supply voltage. The signal conditioning circuit samples the sensor differential voltage and the power supply voltage at a frequency derived from a clock generator. The signal conditioning circuit controls the NMOS transistors coupled to the sensor with a negative bias voltage derived from a single power supply, thus allowing operation when the sensor ground and power supply ground are at different potentials. Additionally, fabricating the signal conditioning circuit impedances as capacitors using linear complimentary metal oxide semiconductor technology produces very accurate gain and input impedance characteristics.

41 Claims, 15 Drawing Sheets

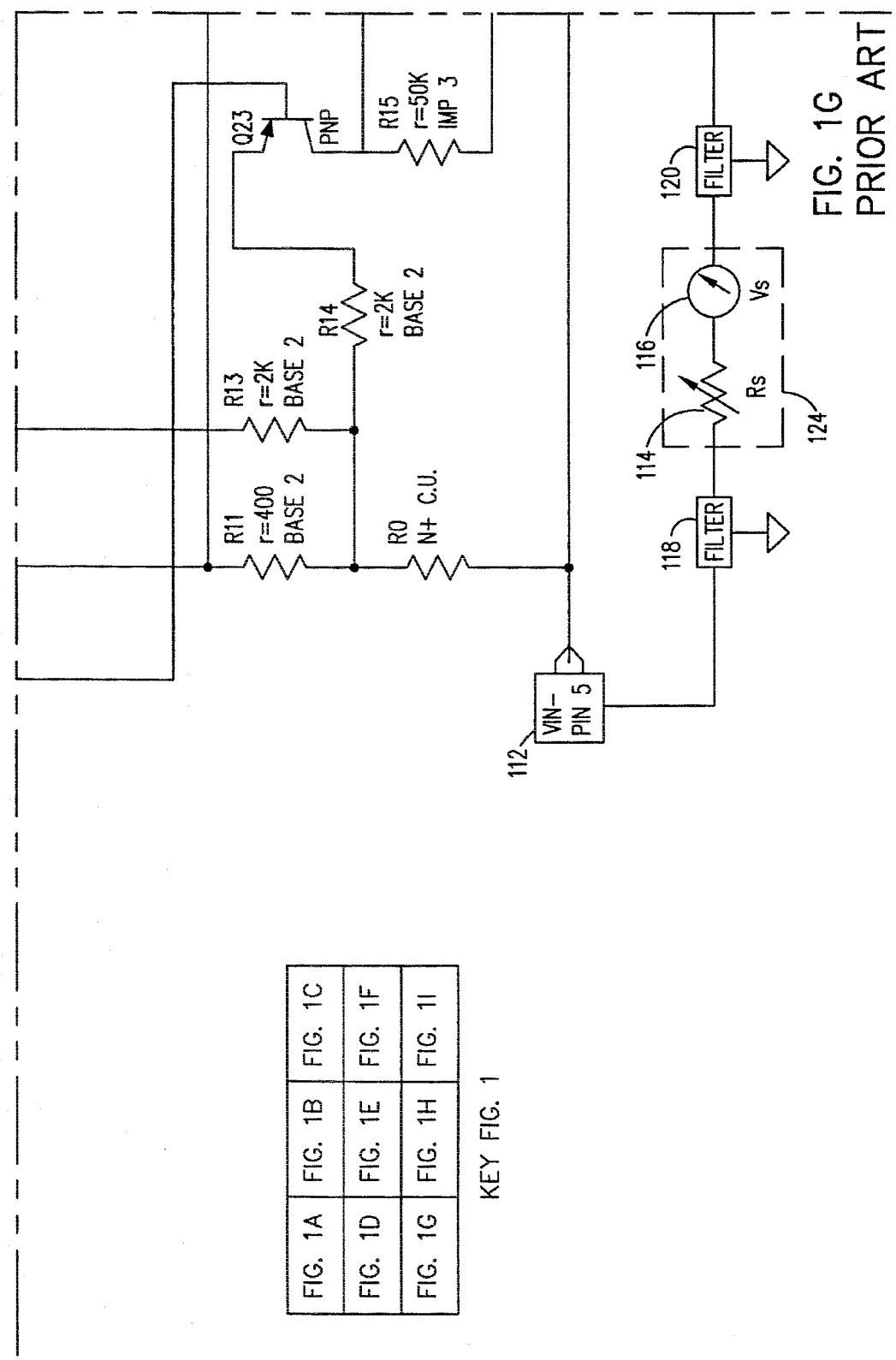

SIGNAL CONDITIONING APPARATUS AND METHOD EXHIBITING ACCURATE INPUT IMPEDANCE AND GAIN CHARACTERISTICS OVER COMMON MODE RANGE AND OPERATIONAL ENVIRONMENTS

This application is a continuation of application Ser. No. 08/286,051, filed Aug. 4, 1994, now abandoned.

BACKGROUND OF THE INVENTION

1. Field of the Invention

The present invention relates to an electrical circuit, and particularly, to an electronic data and signal processing control system, and more particularly, to a signal conditioning unit which detects high impedance input conditions and maintains accurate gain and input impedance over a wide range of operating parameters.

2. Description of Related Art

Signal conditioning circuits are often used as an interface in a signal conditioning unit to convert a differential input signal received from a data source into a more usable output signal. Signal conditioning circuits may be used in conjunction with sensors to receive a sensor input signal and convert the input signal into an output voltage usable by a control system. For example, in order to maintain the quality of air, it is desirable to control internal combustion engine emissions. A signal conditioning circuit may be used in conjunction with an oxygen sensor to produce an output voltage that is related to the oxygen partial pressure in an atmosphere being sensed by the oxygen sensor. The output voltage is received by a signal processing control system to control the fuel-air mixture supplied to the engine which regulates engine performance and reduces undesirable emissions.

The automotive environment introduces a number of severe requirements for the sensor-signal conditioning combination. First, a single power supply is used, usually the automotive battery, which has one terminal connected directly to the vehicle frame. While the oxygen sensor is also connected to the vehicle frame or to the engine block, its location is normally remote from the signal conditioning circuit so that the two frame locations or frame and engine block locations can be operating at substantially different potentials. For example, the oxygen sensor ground can be operating at a DC potential of $\pm 2.0$ volts with respect to the signal conditioning circuit ground. This represents a significant common mode range. Second, the signal conditioning circuit must cope with an oxygen sensor that produces a fractional volt output which varies with oxygen content and has an internal resistance that varies over several orders of magnitude as a function of operating temperature. The signal conditioning circuit should produce a nominal output when the sensor is cold and then produce an oxygen related output as the oxygen sensor warms up during use. Third, the signal conditioning circuit should quickly detect high impedance conditions at the sensor signal conditioning circuit sensor inputs in order to facilitate accurate and prompt response by the receiving control system circuit. Fourth, current flow must be accurately controlled to meet strict requirements involving, for example, sourcing current to the sensor. Fifth, the signal conditioning circuit should require minimal cost expenditures, minimal testing, and occupy minimal space using either discreet and/or integrated components.

FIG. 1 is a schematic diagram of an interface circuit 100 fabricated as an integrated circuit and utilized as a signal conditioning circuit in an automotive environment to interface between an oxygen sensor and a fuel-air mixture control system. The interface circuit 100 is a LM1964D circuit manufactured by National Semiconductor, a Santa Clara, Calif. company. To provide a common mode operating range, the interface circuit 100 uses input diodes to level shift the input signal. As a result, the acceptable common mode range of interface circuit 100 varies with temperature because the diode voltage decreases when the operating temperature of the interface circuit 100 increases and is only about $\pm 1$ V.

In an automotive application, an oxygen sensor 124 represented by a variable resistor 114 and a voltage source 116 is connected via filters 118 and 120 across the non-inverting input 110 and the inverting input 112 of interface circuit 100. In order to detect open circuit conditions at the input of interface circuit 100, an open circuit detection circuit 104 is also connected across the non-inverting input 110 and the inverting input 112 and provides a bias voltage with the 1.2 Mohm resistor 122 conducting a current of only a few nanoamps. When the series impedance of the oxygen sensor 124 is low compared to resistor 122, as is the case in normal operation, the oxygen sensor 124 sinks the open circuit detection circuit 104 current, and the open circuit detection circuit 104 only minimally affects the interface circuit 100 output voltage. However, when a lead in the external circuit between non-inverting input 110 and inverting input 112 is broken and causes an open circuit condition or when the oxygen sensor 124 is cold and presents a high impedance, the open circuit detection circuit 104 provides the input current to drive the interface circuit 100 output to a predetermined value to establish a default fuel-air mixture. However, because the small current on the order of a few nanoamps is used in the open circuit detection circuit 104 to facilitate normal oxygen sensor 124 operation, the reaction time of interface circuit 100 to oxygen sensor 124 open circuit conditions extends over a finite period of time, $t_{oc}$, and is too lengthy for more stringent emissions control specifications.

Additionally, as emissions control specifications become more stringent, a signal conditioning circuit must be able to comply by reacting more quickly and accurately not only to open circuit conditions but also to changing sensor inputs. A microcontroller (not shown) relies in part on the accuracy of the interface circuit 100 input impedance and precise gain characteristics to provide accurate and responsive control signals to other systems such as the fuel-air mixture controller (not shown). The interface circuit 100 incorporates zener diodes in circuits 102, 106, and 108 which are trimmed during testing to provide input impedance and gain characteristics. However, zener trimming is associated with parameter tolerances of such magnitude that providing the precision operating parameters for interface circuit 100 necessary to meet ever more stringent emissions control specifications will be increasingly non-trivial and costly to achieve especially over a large production run of fabricated interface circuits.

Another disadvantage of zener trimming on the interface circuit 100 involves the costs associated with testing and fabrication. Testing of the interface circuit 100 is performed by a test system at the wafer level by measuring circuit errors in response to applied test signals. In order to correct the measured errors, the test system short circuits the zener diodes. The costs associated with zener trimming include test time to measure errors, trim the zeners, and repeat the test process until desirable circuit characteristics are obtained. Furthermore, the zener trimming requires allocating valuable circuit area to diodes which potentially may be short circuited.

SUMMARY OF THE INVENTION

The present invention overcomes the difficulties encountered in the related art by providing a circuit with a common mode range sufficient to meet operating environment requirements, an accurate and precise input impedance and accurate gain which may be reliably reproduced during fabrication, quick detection of input signal changes including the detection of input open circuit conditions, and easily adjustable operating characteristics.

One embodiment of the present invention is a signal conditioning circuit having terminals to receive clock generated control signals. The signal conditioning circuit includes an amplifier having an input terminal and an output terminal and an input impedance having a first terminal coupled to the amplifier input terminal and a second terminal. The signal conditioning circuit further includes an input circuit coupled to the input impedance second terminal and having first means responsive to a first clock generated control signal for switching the input impedance second terminal between first and second signal source input terminals. Furthermore, the signal conditioning circuit includes a high impedance detection circuit including a detection impedance having a first terminal coupled to the input impedance second terminal and a second terminal and includes a feedback circuit including a feedback impedance having a first terminal and a second terminal coupled across the amplifier input and output terminals, respectively.

In another embodiment, the present invention is a method of processing an output signal from a sensor to provide a conditioned signal indicative of a property of a sensed event during normal sensor operation and a nominal indication during abnormal sensor operation. The method includes the steps of charging a first impedance from a first voltage through a second impedance included in the sensor, the second impedance being responsive to the sensed event, charging the first impedance primarily from a second voltage through a third impedance when the second impedance is greater than the third impedance, applying a third voltage to the first impedance to impose a charge on the first impedance resulting in an excess charge from the charging steps on the first impedance, and modifying an output signal of the amplifier to transfer the excess charge on the first impedance to a fourth impedance in the feedback path of the amplifier, wherein the output signal is conditioned.

BRIEF DESCRIPTION OF THE DRAWINGS

Reference numerals and letters referring to the same features appearing in multiple figures are the same.

DETAILED DESCRIPTION OF THE PREFERRED EMBODIMENT

Figure 1A:
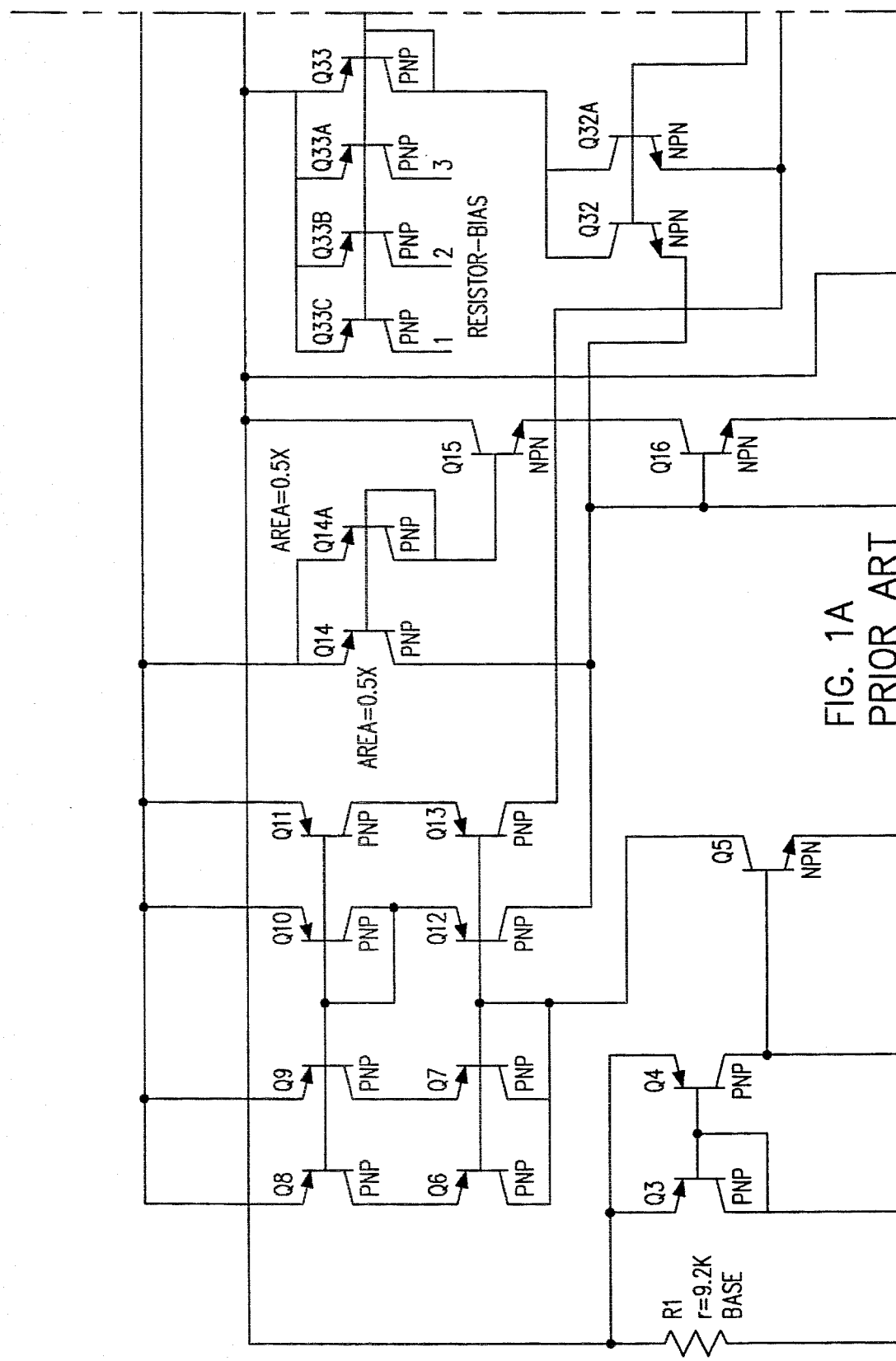
FIG. 1 is a transistor-level schematic diagram of a National Semiconductor LM1964D interface circuit.
Figure 1B:
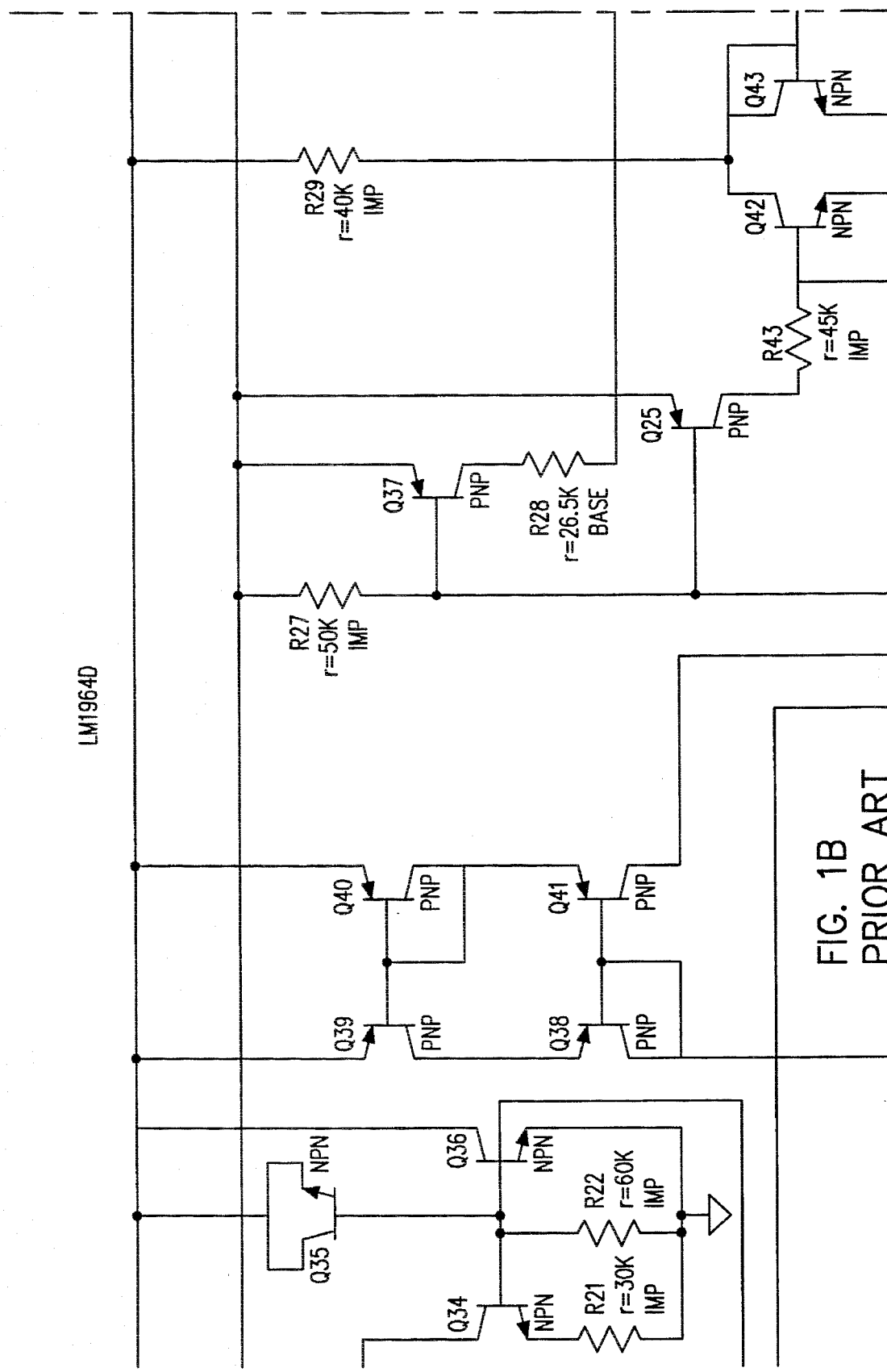
Figure 1C:
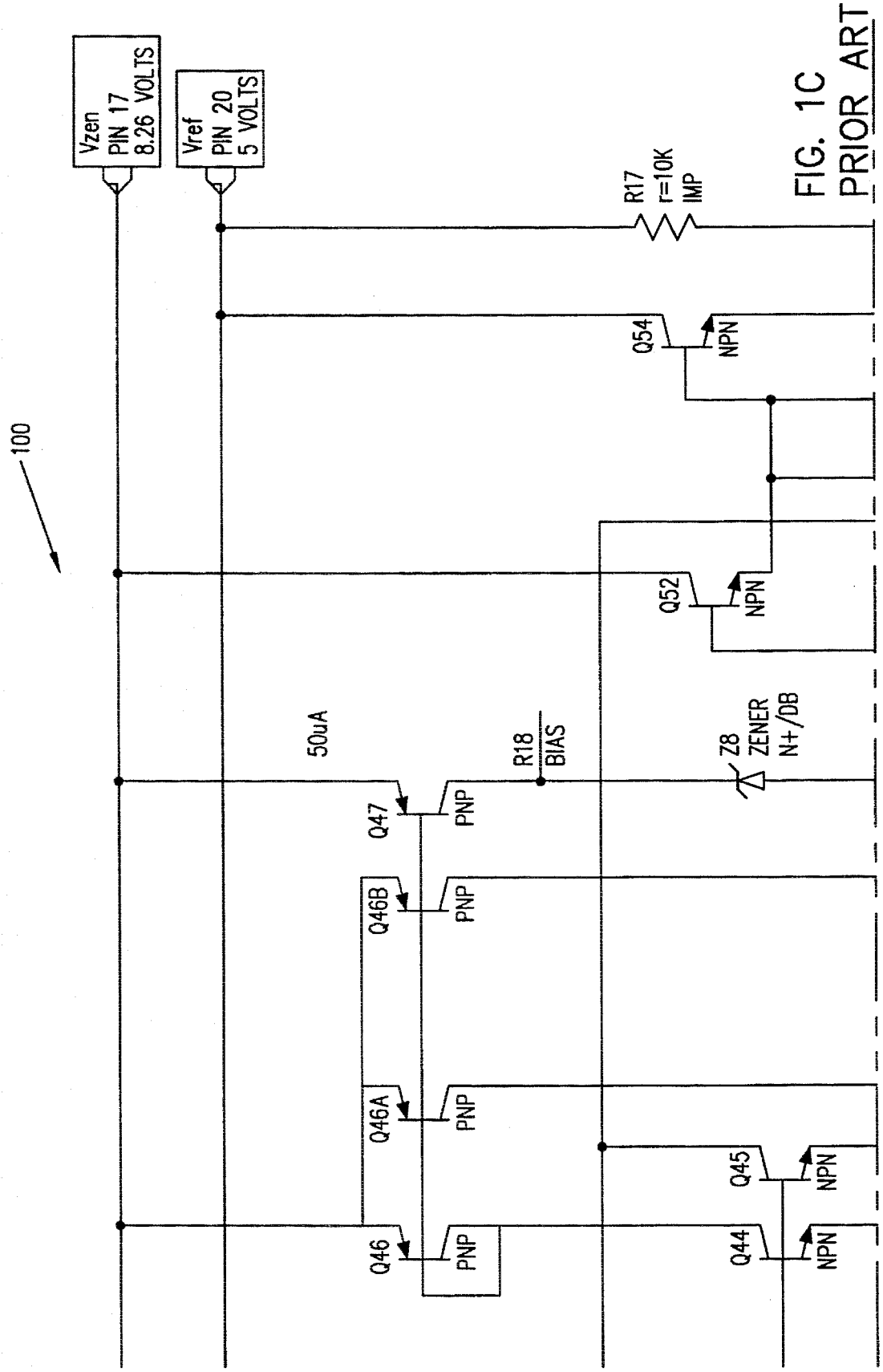
Figure 1D:
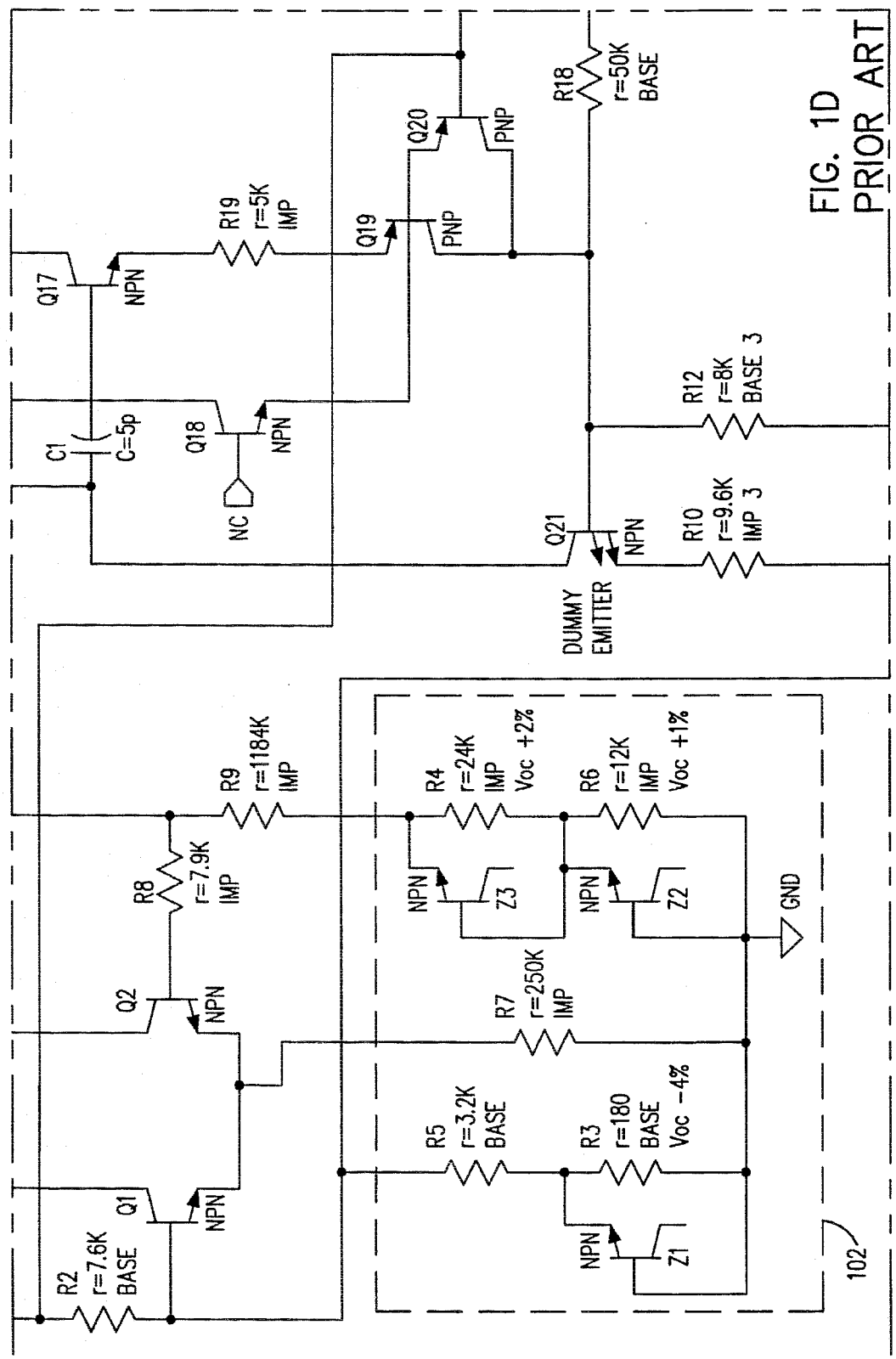
Figure 1E:
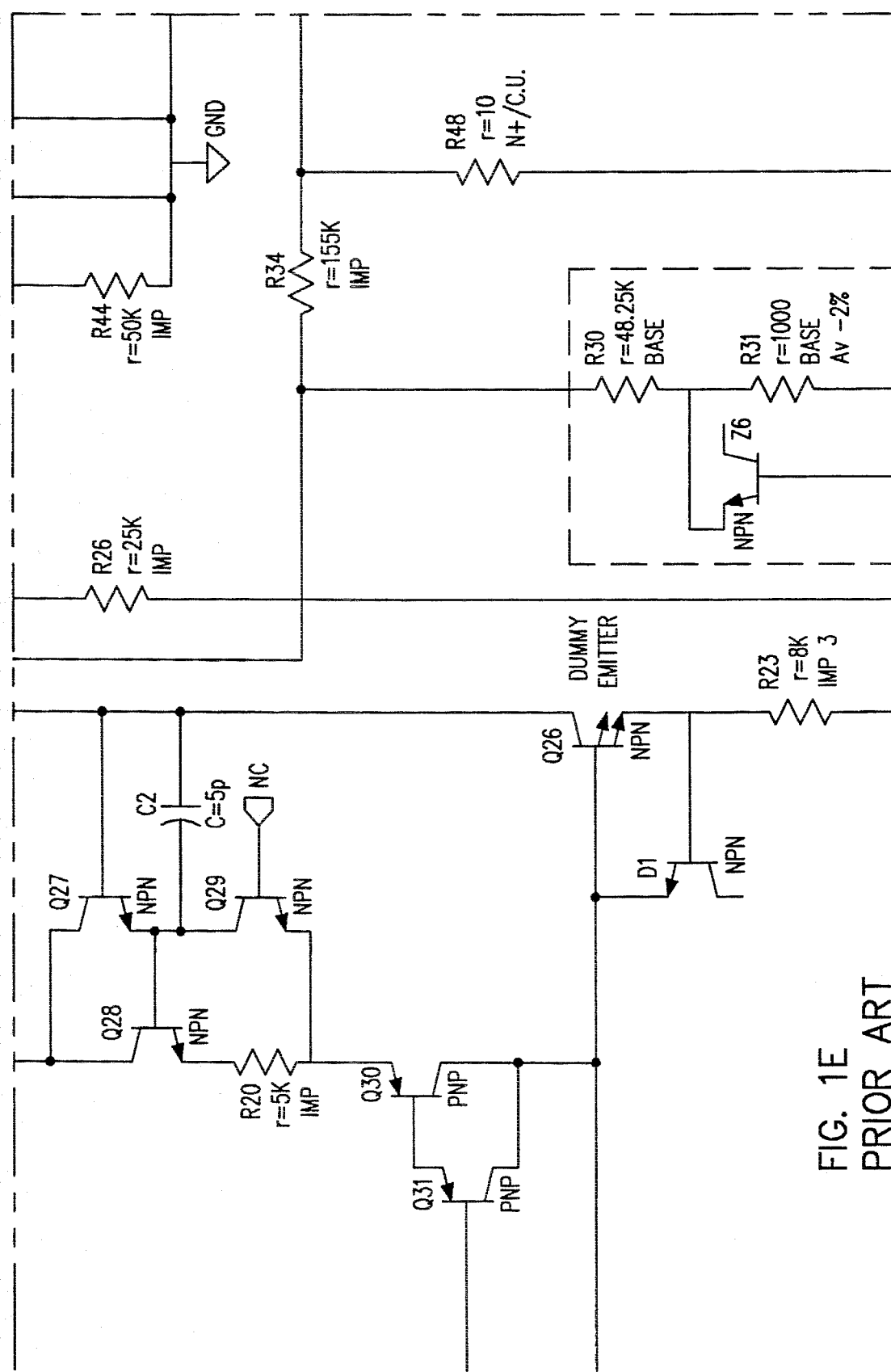
Figure 1F:
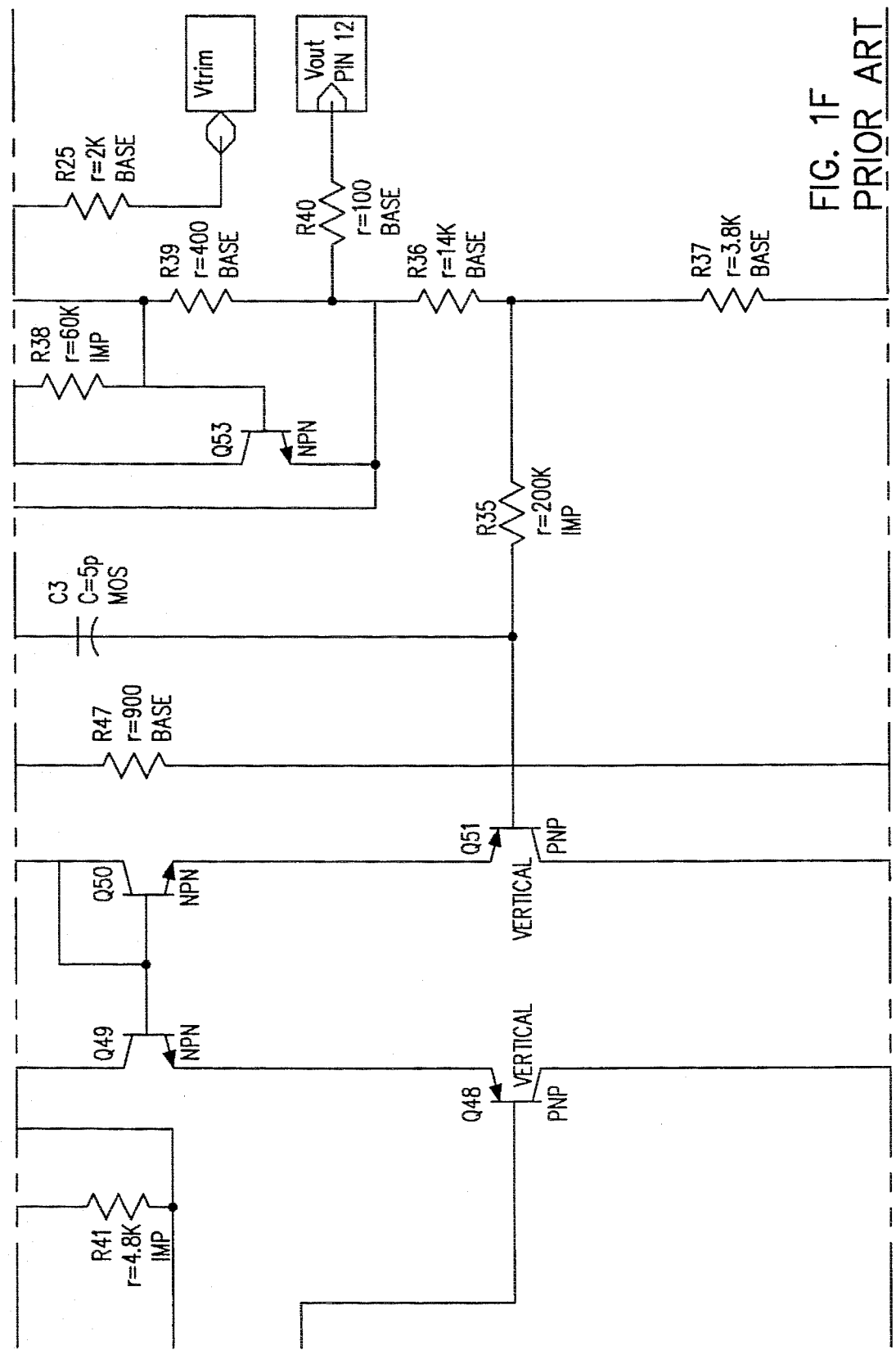
Figure 1H:
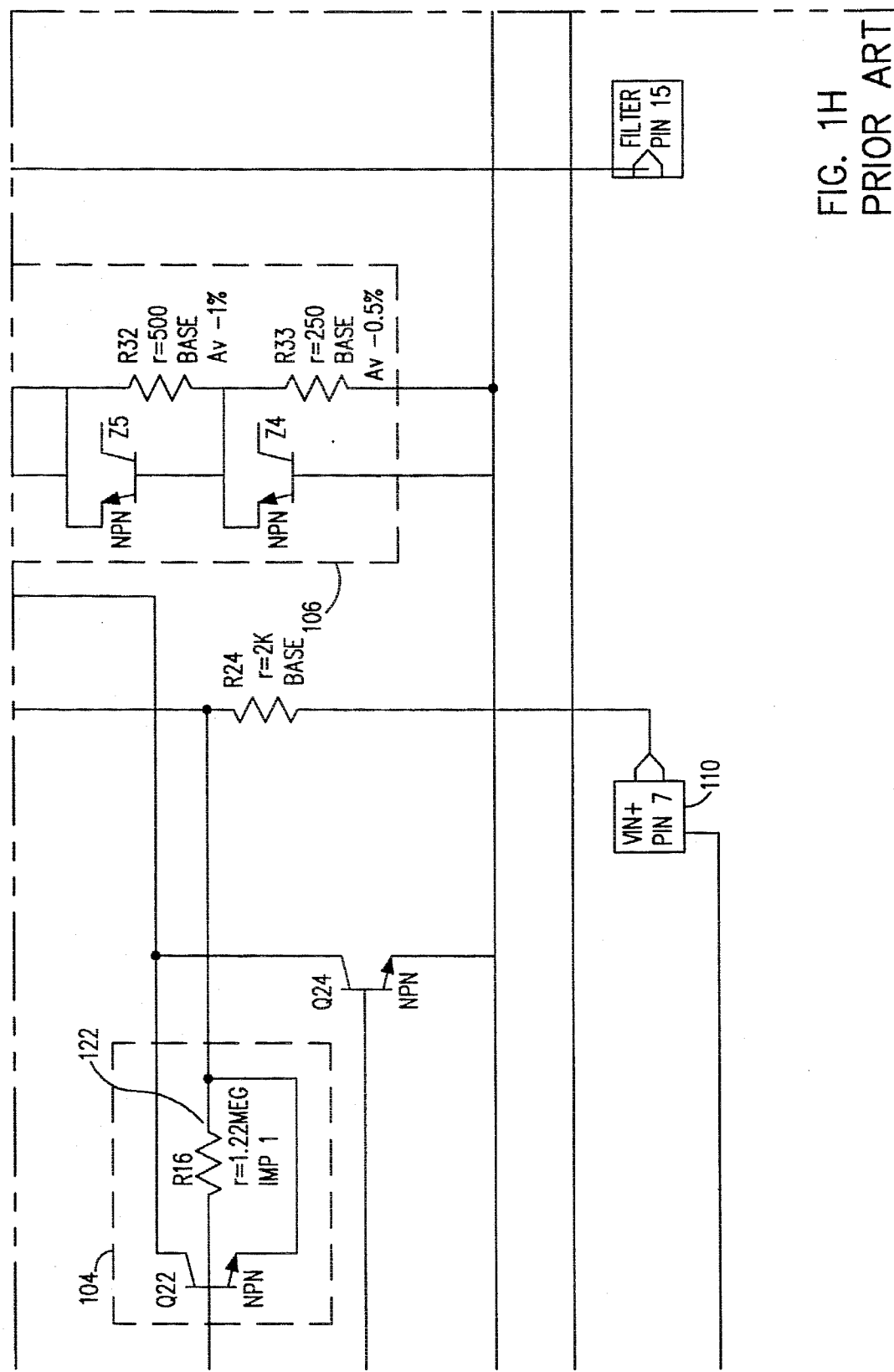
Figure 11:
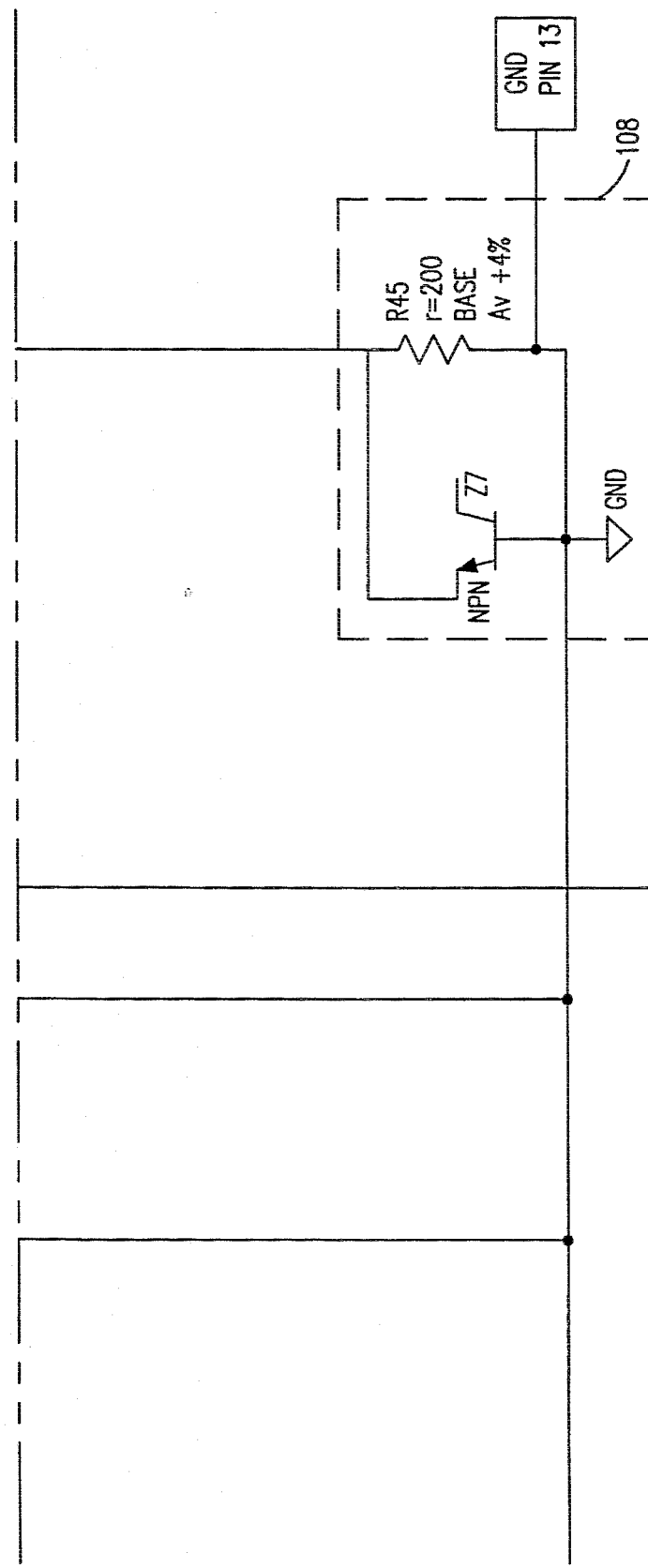
Figure 2:
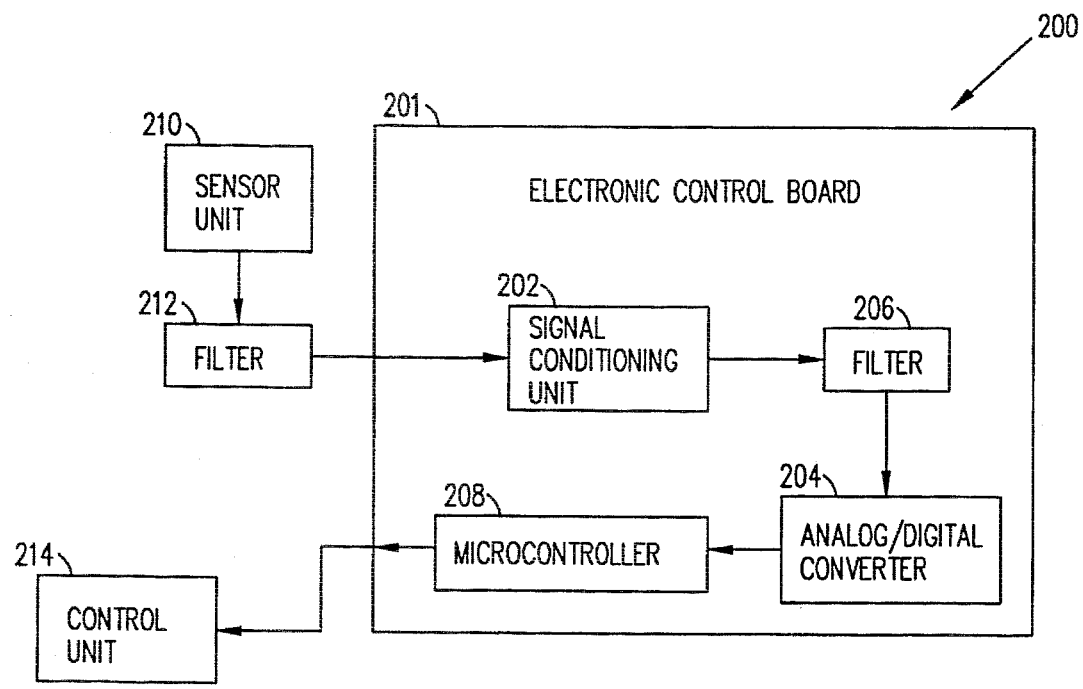
FIG. 2 is a block schematic diagram of an electronic data input and signal processing system block diagram.

FIG. 2 illustrates an electronic data and signal processing control system 200. The electronic data and signal processing control system 200 is useful, for example, in applications involving engines where exercising control over fuel-air mixtures is desired. The electronic data and signal processing control system 200 interfaces with virtually any oxygen sensor present in automobiles with catalytic converters. In FIG. 2, data signals are produced in a remotely located sensor unit 210 and received by the electronic control board 201 after being filtered by a low pass (4 kHz) filter 212. The electronic control board 201 is a circuit board which contains connections (not shown) for incorporating the signal conditioning unit 202, analog/digital converter ("A/D converter") 204, and a microcontroller 208. The output signal of the signal conditioning unit 202 is filtered through a low pass filter 206 with a 3 db frequency of 350 Hz. The filter circuit 206 is connected between the analog/digital converter 204 and the microcontroller 208. The signal conditioning unit 202, analog/digital converter ("A/D converter") 204, and microcontroller 208 are individually packaged integrated circuits. However, the circuits 202–208 and the filter circuit 206 may alternatively be fabricated as a single integrated circuit. The data signals received from the sensor unit 210 are processed by the signal conditioning unit so as to produce an analog output which after being processed by filter 206 and A/D converter 204 is useful to the microcontroller 208. The output of the microcontroller 208 is received by a control unit 214 such as a fuel-air mixture controller.

When utilizing the electronic data and signal processing control system 200 in automotive applications the sensor unit 210 is an oxygen sensor. Oxygen sensors used in automotive applications are well known in the art. They have a temperature dependent series resistance and produce a differential output voltage corresponding to the oxygen present in the exhaust gasses of an internal combustion engine (not shown). Also in an automotive application, the filter 206 is constructed of a discrete resistor (not shown) connected between two capacitor terminals of two capacitors (not shown), respectively, with the other two capacitor terminals connected to the electronic control board 201 ground potential. This configuration allows only the low frequency components of the signal conditioning unit 202 output signal to pass to the A/D converter 204, thus eliminating unwanted high frequency noise components. In response to the digital signal corresponding to the low frequency analog output of signal conditioning unit 202, the microcontroller, for example, adjusts the fuel-air mixture control unit (not shown) in the internal combustion engine.

Figure 3:
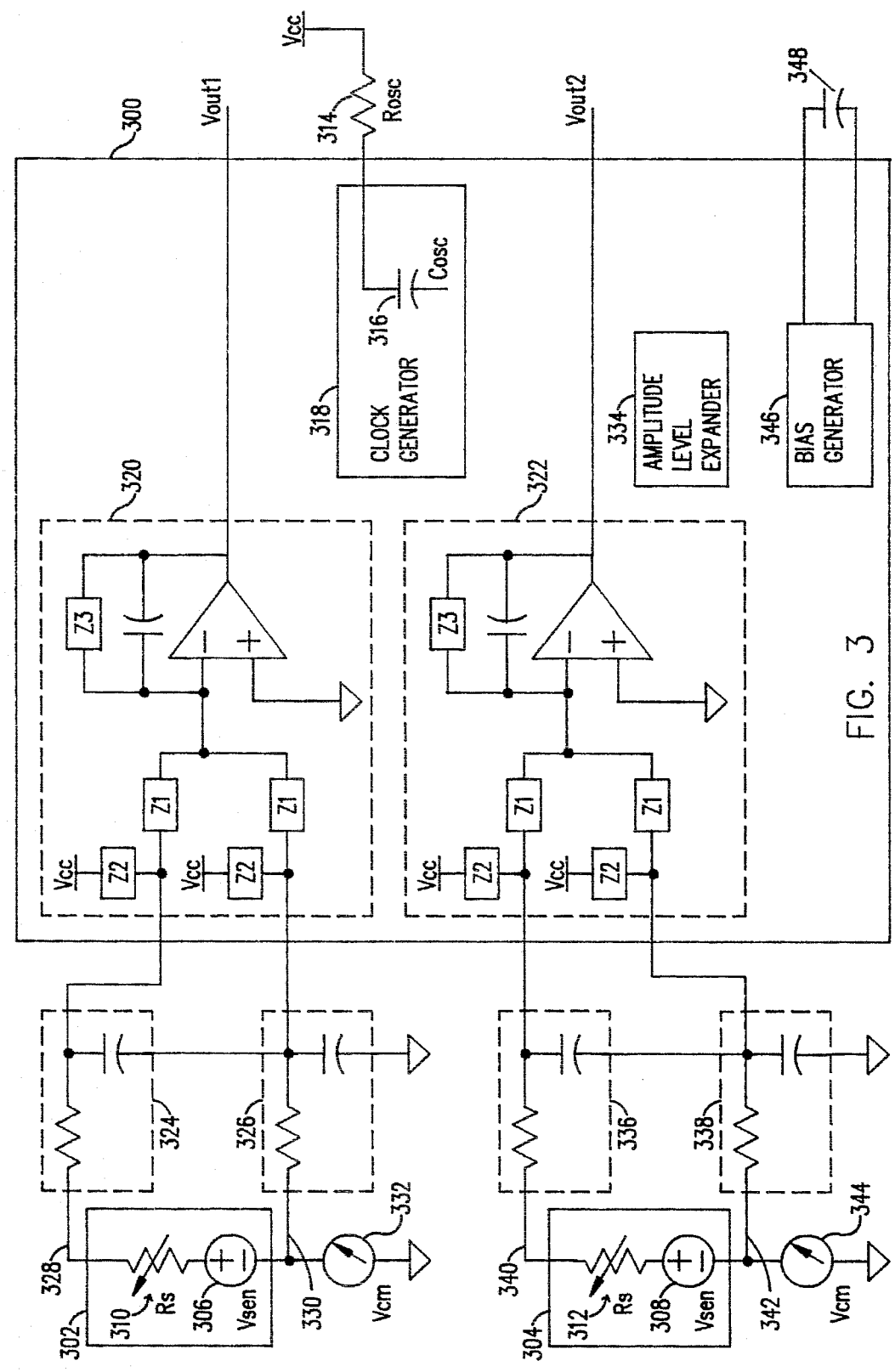
FIG. 3 is a topological diagram of a Dual Oxygen Sensor Unit connected to oxygen sensor units.

Referring to FIG. 3, a topological diagram is shown of a signal conditioning unit 300 incorporating two signal conditioning circuits 320 and 322 connected to two oxygen sensor units 302 and 304 respectively. The circuit components constituting signal conditioning unit 300 are fabricated as a single integrated circuit. The sensor unit 210 of FIG. 1 is represented, for example, by two oxygen sensors 302 and 304 which are each represented by a voltage source 306 and 308, respectively, and a variable resistor 310 and 312, respectively.

A first pair of low pass filters 324 and 326 are shown connected between the differential inputs 328 and 330, respectively, of oxygen sensor 302 and signal conditioning circuit 320. A second pair of low pass filters 336 and 338 are shown connected between the differential inputs 340 and 342, respectively, of oxygen sensor 304 and signal conditioning circuit 322. The common mode voltage ranges between signal conditioning circuit 320 and oxygen sensor 302 and signal conditioning circuit 332 and oxygen sensor 304 are represented by variable voltage sources 332 and 344, respectively. Also present in the signal conditioning unit 300 is an amplitude level expander circuit 334 which expands the voltage amplitude of a single power supply connected to the signal conditioning unit 300 (not shown) and provides the expanded voltage amplitude to various circuit elements (not shown) of signal conditioning circuits 320 and 322, and a clock generator 318 which provides timing signals to various circuit elements (not shown) of signal conditioning circuits 320 and 322 and is connected to an external, high accuracy resistor, Rosc, 314. Additionally, a bias generator circuit 346 connected to external capacitor 348 is present to generate a negative voltage from a positive potential clock signal referenced to 0 volts to bias p- doped wells of various circuit elements of signal conditioning circuits 320 and 322. Using a capacitor and a high accuracy external resistor such as capacitor Cosc 316 and Rosc 314 in FIG. 3, the clock generator 318 can provide a well defined clock frequency ("$f_{clk}$") where $f_{clk}=1/(2*Cosc*Rosc)$. The capacitor Cosc 316 is fabricated as part of the signal conditioning unit integrated circuit 202 in FIG. 2 and, therefore, can be closely matched with other capacitors fabricated as part of the same integrated circuit such as capacitors C1–C4 in FIG. 4. Utilizing an external high accuracy resistor provides advantages such as providing flexibility to easily adjust the clock frequency by easily replacing Rosc 314 with resistors of different values.

Figure 4:
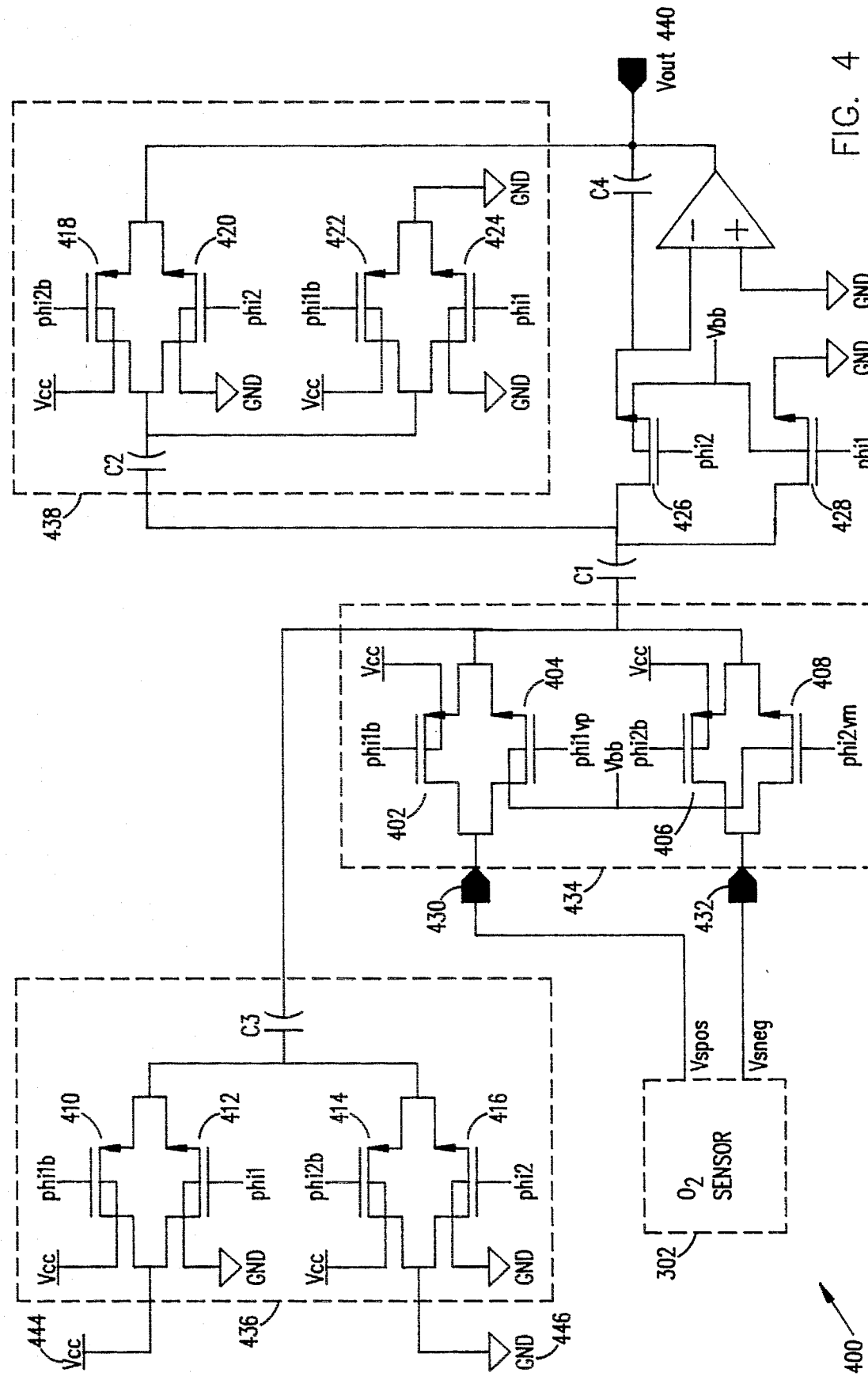
FIG. 4 is a schematic diagram of a switched capacitor signal conditioning circuit.

Referring now to FIG. 4, a signal conditioning circuit 400 using switched capacitors is illustrated. Because signal conditioning circuit 400 is fabricated using a conventional linear complimentary metal oxide semiconductor ("Linear CMOS") technology, capacitor values typically are matched to within approximately 0.1%. The capacitors C1–C4 are fabricated using a thin oxide, fairly planar Linear CMOS process with a metal conductor, a polysilicon conductor, and a silicon dioxide dielectric. Additionally, the values of integrated capacitors C1–C4 do not vary appreciably over temperature ranges such as those experienced in a working internal combustion engine. The signal conditioning circuit 400 offers a wide common mode operating range, accurate, stable gain, and precise input impedance, and rapid detection of high impedance conditions across signal conditioning circuit 400 inputs over a wide variety of operating conditions such as those experienced in internal combustion engine applications, particularly automotive applications. Signal conditioning circuit 400 provides the precise input impedance, voltage gain, and high impedance detection characteristics which are often necessary and are particularly necessary in automotive applications. (Note: "precise" is used in the context of being able to implement device characteristics with low component tolerances).

Precise input impedance accounts for several properties such as allowing the signal conditioning circuit 400 to sink only small amounts of current from a sensor unit. Additionally, precise input impedance assists the signal conditioning circuit 400 in providing a voltage output ("Vout") 440 which is a precise representation of the oxygen sensor output during normal sensor operation or a precise known nominal value when a high impedance condition across the signal conditioning circuit 400 inputs is detected. Referring to FIG. 2, a precise signal conditioning unit 202 voltage output is required because the microcontroller 208 is programmed to provide an output command signal corresponding to a received input. If the input to the microcontroller 208 is not the expected input corresponding to actual conditions as detected by the sensor unit 210, the microcontroller 208 output will not communicate a proper output command signal. For example, in an automotive application, if the output of the signal conditioning unit 202 is "X" in response to sensor unit 210 input "I" then the microcontroller 208 command signal is "Y". However, if because of inaccuracies in input impedance and/or gain, the output of signal conditioning unit 202 is "X1" in response to sensor unit 210 input "I" then the microcontroller 208 command signal will be "Y1". The "Y1" output results in an improper fuel-air mixture.

Precise high impedance detection characteristics are also necessary because, for example, in an automotive application the microcontroller 208 will scan for a predetermined nominal output voltage of the signal conditioning unit 202 which corresponds to a high impedance condition at the signal conditioning unit 202 inputs. The closer the actual nominal output is to the predetermined nominal value, the faster the microcontroller 208 will provide a command signal corresponding to the high impedance condition.

In the switched capacitor configuration of FIG. 4, the input impedance ("Zin"), the voltage gain ("Av") error, and the high impedance nominal output voltage are all determined in part by the clock generator 316 (FIG. 3) and, therefore, may be varied by changing the clock frequency. Zin is derived from C1 and $f_{clk}$, and the relationship between Zin, C1, and $f_{clk}$ can be specified as Zin=$1/f_{clk}*C1$. Substituting for $f_{clk}$, Zin=$2*Cosc*Rosc/C1$ where C1=6.2238pF, Cosc=20pF, and Rosc=178 kohm. Therefore, Zin=1.14 Mohm where the typical input impedance tolerance in automotive applications is 1.5 Mohm –1.02 Mohm. Because Zin is derived from well matched capacitors and an external high accuracy resistor, it can be defined more accurately than using only resistors as in the related art. Therefore, the signal conditioning circuit 400 is able to provide the precision input impedance required by applications such as automotive applications.

During normal operation in an automotive application the outputs, $V_{Spos}$ and $V_{Sneg}$, of an oxygen sensor such as oxygen sensor 302 are connected across the inputs 430 and 432, respectively, of the signal conditioning input circuit 434. The sensor outputs $V_{Spos}$ and $V_{Sneg}$ are typically filtered through a 4 kHz low pass filter (not shown) before being applied to the signal conditioning input circuit 434 inputs. When the sensor is operating normally the oxygen sensor 302 develops a differential voltage of 50–950 mV depending on the exhaust gas oxygen content and has a relatively low series resistance (approximately a few hundred ohms) when the sensor is at normal operational temperatures e.g. 595° C. in an internal combustion engine. The difference in voltage is sampled by the signal conditioning circuit 400 and multiplied by the voltage gain ("Av") of the system. As discussed above Av must be accurate over the full operating parameters of the application environment.

With the signal conditioning circuit 400 utilizing an operational amplifier 442, feedback circuit 438, and input circuit 434, Av during non-high impedance conditions is defined by the ratio of well matched capacitor C1 divided by capacitor C2 where the input voltage sampling frequency is derived from the $f_{clk}$. Therefore, the high accuracy resistor, Rosc 314 of FIG. 3, combined with well matched capacitors provides a very accurate and stable voltage gain. Furthermore, when C1=6.2238PF and C2=1.365pF, Av=4.56 and Vout=4.56* the differential input voltage. Since the nominal input impedance in automotive applications is approximately 1.2 Mohm, a resistor substituted for C2 would have a value of 4.56*1.2 Mohm or 5.5 Mohm. Well resistors, which are doped regions of the substrate, of this magnitude are inaccurate and voltage dependent. During normal operations of the sensor 302 the effect of detection impedance, capacitor C3, on gain accuracy during normal oxygen sensor 302 operation is virtually nonexistent because of its high impedance (approximately 10 Mohms in automotive applications). Capacitor C4 provides low pass filtering and maintains Vout during the discharge of C2. In automotive applications, C4 is selected to provide a 3 dB frequency of 350 Hz; noting that the larger C4 is, the less susceptible signal conditioning circuit 400 is to clock feed through and automobile engine noise. With a value of 56.4 pF, C2 has negligible effect on Av.

Figure 5:
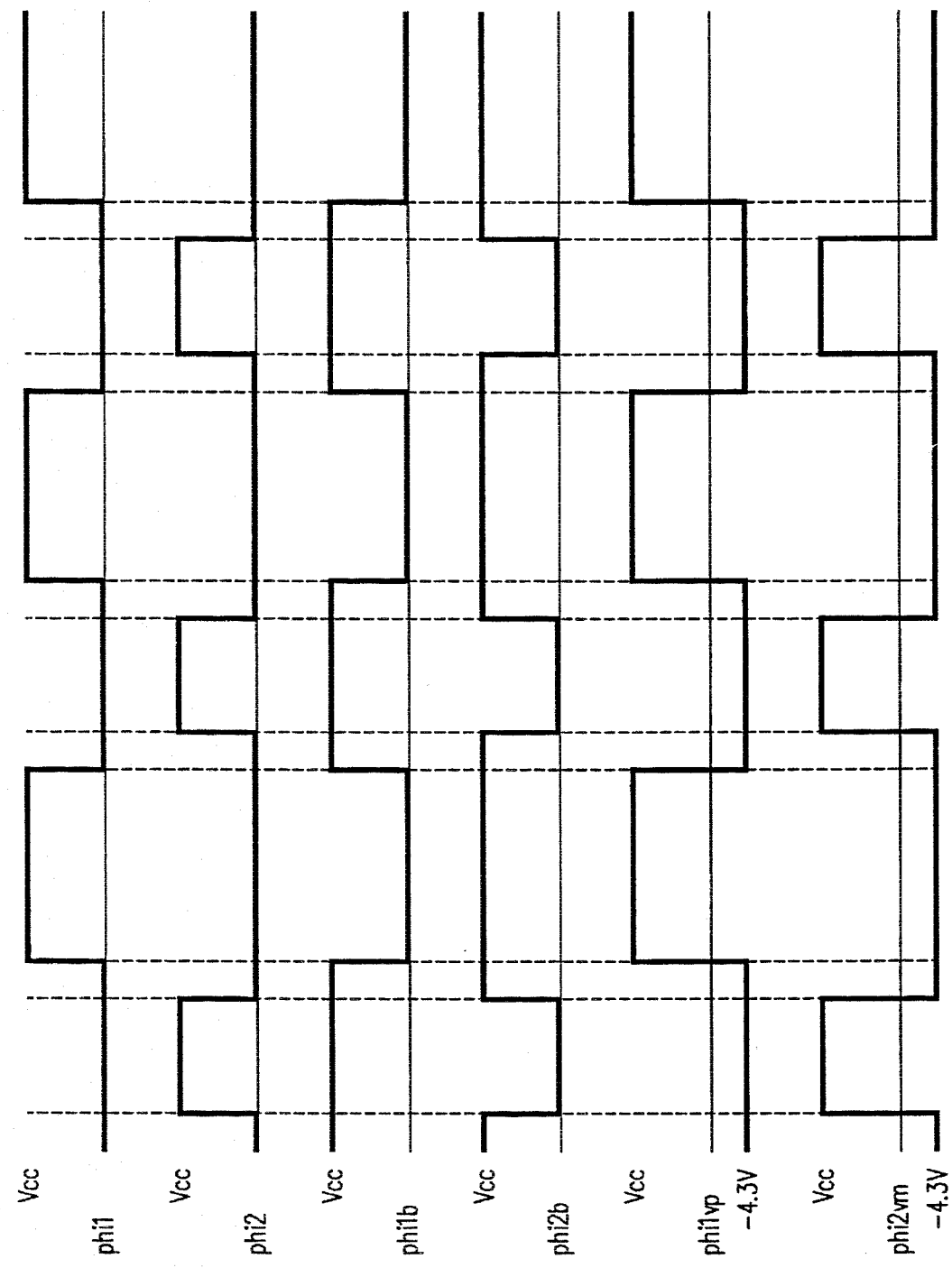
FIG. 5 is a graph of a plurality of clock pulses for application to the circuit of FIG. 4.

Referring to FIG. 4, switches composed of PMOS and NMOS transistors pairs 402 and 404, 406 and 408, 410 and 412, 414 and 416, 418 and 420, and 422 and 424 along with switches 426 and 428 provide conduction paths and open circuits corresponding to the gate voltage command timing signals phi1, phi2, phi1b, phi2b, phi1vp, and phi2vm shown in FIG. 5. NMOS transistors 426 and 428 do not need to be used in conjunction with PMOS transistors because operational amplifier 442 forces the transistor 426 source to signal conditioning circuit 400 ground and the source of transistor 428 is tied to signal conditioning circuit 400 ground. The gate voltage command timing signals are derived from $f_{clk}$. In FIG. 4, when phi1 is high, transistors 402, 404, 410, 412, 422, 424, and 428 conduct while the remaining transistors are non-conductive. This allows C1 to charge to the voltage $V_{Spos}$. C2 is discharged while C4 acts not only as a low pass filter but also "holds" charge from the previous phase of the gate voltage command timing signals to ensure that Vout 440 does not collapse to 0 V. Because C2 is discharged during each period of phi1, the differential input signal is not integrated over multiple periods of phi1. Subsequently, phi1 goes to 0 V. After a short period, as shown in FIG. 5, in which both phi1 and phi2 are low to prevent any contention between $V_{Spos}$ and $V_{Sneg}$ at C1, phi2 goes to high. As phi2 goes high, operational amplifier moves to drive the terminal of C1 connected to the inverting input to ground. The charge equal to $(V_{Spos}-V_{Sneg})*C1$ is now transferred to C2. Therefore, Vout 440 =the charge divided by C2 which equals $(V_{Spos}-V_{Sneg}) * C1/C2$. The configuration of input circuit 434 and the non-overlapping phi1b, phi1vp, phi2b, and phi2vm allow signal conditioning circuit 400 to sample a differential voltage input. Also, when operational amplifier 442 is utilized in automotive applications, the operational amplifier 442 preferably has a power supply voltage (Vcc)= 4.75 V to 5.25 V, an operating temperature range of –40° C. to +125° C., an open loop gain of 100 dB, a unity gain frequency of 500 kHz, an amplifier offset voltage of less than 5 mV, a D.C. power supply rejection ratio of –70 dB, a power supply rejection ratio at 40 kHz of greater than –40 dB, a minimum output high voltage at $I_L$=–2μA of greater than or equal to Vcc–0.1 V, and a maximum output low voltage at $I_L$=+2μA of less than or equal to 0.1 V.

When a high impedance condition exists across the inputs 430 and 432 in applications such as automotive applications, the signal conditioning circuit 400 must quickly detect the high impedance condition and provide an accurate predetermined output voltage. In an automotive application, the typical predetermined output voltage equals approximately 0.405*Vcc or 2.025 V. A high impedance condition may exist if, for example, an oxygen sensor, 302 is cold or has an open circuited lead. During a high impedance condition, the net charge distributed between capacitors C1 and C2 would be zero, and Vout 440 would go to almost 0 V if high impedance detection circuit 436 were not present. In order to force Vout 440 to the predetermined output voltage, high impedance detection circuit 436 is incorporated into signal conditioning circuit 400. As the input impedance across inputs 430 and 432 increases, switched capacitor C3 becomes more prominent in determining Vout 440 by providing signal source Vcc 444 and gnd 446 to charge capacitor C1 and altering the gain of signal conditioning circuit 400. When the impedance across inputs 430 and 432, for example when the oxygen sensor 302 resistance reaches 10 Mohms, increases to a predetermined value, C3 is in series with C1 and Vout 440=[C3/(C3+C1+$C_{PAR}$)]* (C1/C2) * Vcc where $C_{PAR}$ is a parasitic capacitance primarily resulting from the coupling capacitance of the polysilicon conductor of C1 to ground and secondarily to the drain-source junction capacitance of transistors 404 and 408. When C1=6.2238 pF, C2=1.365 pF, C3=0.809 pF, and $C_{PAR}$ =2.044 pF, Vout 440=[C3/(C3+C1+$C_{PAR}$)]*4.56*, Vcc or Vout=0.406*, Vcc which is an acceptable output voltage in an automotive application under the high impedance conditions described above.

Although signal conditioning circuit 400 may be clocked at various frequencies, in an automotive application the clock frequency is established at 100 kHz. Since signal conditioning circuit 400 is clocked at 100 kHz and always has charge available to drive the operational amplifier 442, signal conditioning circuit 400 establishes the predetermined output voltage Vout 440 during high impedance conditions across signal conditioning circuit 400 inputs faster than the interface circuit 100 in FIG. 1 because the differential inputs are sampled at 100 kHz and the input impedance and gain characteristics are more precise. Additionally, since the impedance of C3 in FIG. 4 is very large (approximately 7.49 Mohms), very little current is sourced into the oxygen sensor 302 when the oxygen sensor 302 has a high series impedance. Additionally, C3 as well as C1, C2, and C4 require very little area to achieve such a large impedance.

The signal conditioning circuit 400 is also capable of operating with very accurate differential input impedance, gain, and high impedance detection at large common mode voltages, such as ±2 V in automotive applications between oxygen sensor 302 ground and signal conditioning circuit 400 ground. This is achieved by biasing the substrates of NMOS transistors 404, 408, 426, and 428 with Vbb which equals approximately –4 V and biasing the gates of NMOS transistors 404 and 408 with phi1vp and phi2vm, respectively. As shown in FIG. 5 phi1vp and phi2vm swing from +5 V to –4.3 V. This ensures that even when the maximum negative common mode voltage of –2 V is present at input 432 and 430, both NMOS transistors 404 and 408 will easily be able to turn off.

Figure 7:
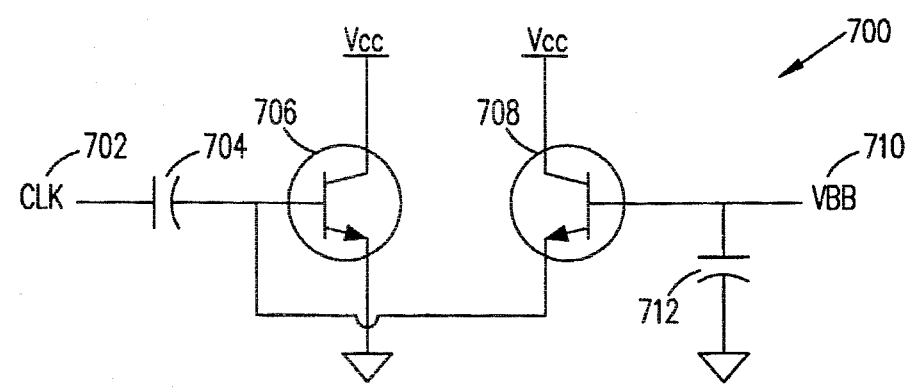
FIG. 7 is a schematic diagram of a bias generator circuit.

Referring to FIG. 7, a bias generator circuit 700 is shown. Initially when a high CLK signal 702 is received, capacitor 704 attempts to charge to the CLK signal 702 voltage. However, the base to emitter junction voltage, Vbe, of transistor 706 charges capacitor 704 to a voltage equal to the CLK signal 702 voltage minus Vbe of transistor 706. When a low CLK signal 702 is received the transistor 706 base side of capacitor 704 is forced to a potential of the high CLK signal 702 minus Vbe of transistor 706, such as –4.3 volts when the high CLK signal is +5 volts, the low CLK signal is 0 volts, and the Vbe of transistor 706 is 0.7 volts. Since the base of transistor 706 is connected to the emitter of transistor 708, the low voltage at the base of transistor 706 turns on transistor 708, and Vbb 710 obtains a voltage equal to the base voltage of transistor 708 plus the base to emitter voltage of transistor 708 which is about −4 volts. Capacitor 712 serves to maintain the voltage level of Vbb 710. Capacitor 704 is located external to signal conditioning unit 300 of FIG. 300 and has a value of 100 pF. Capacitor 712 has a value of 7 pF.

Figure 6:
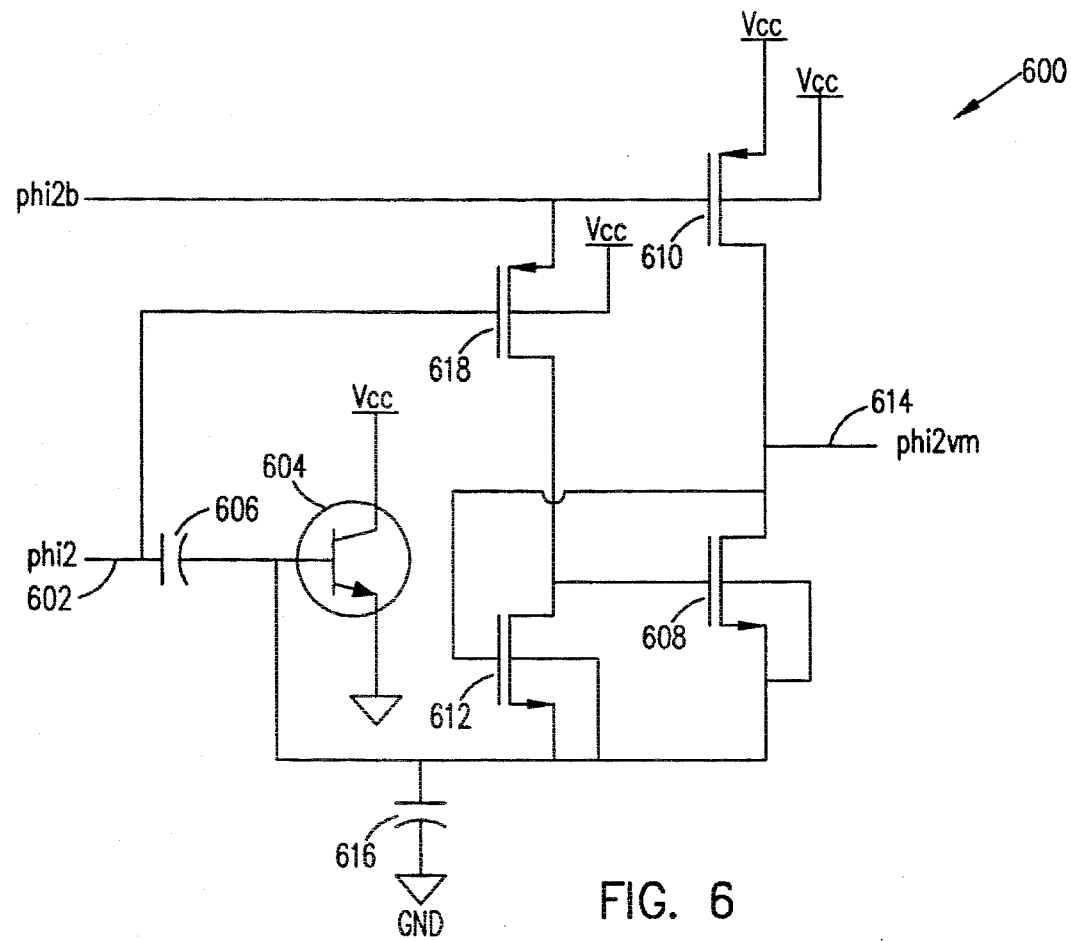
FIG. 6 is a schematic diagram of an amplitude level expander circuit.

Signals phi1vp and phi2vm are both generated using the same +5 V Vcc source as signal conditioning circuit 400. FIG. 6 illustrates an amplitude level expander circuit 600 which is part of the signal conditioning unit 202 of FIG. 2 and may be fabricated as part of the same integrated circuit with signal conditioning circuits as shown in FIG. 3. Although, FIG. 6 shows the generation of phi2vm, phi1vp is also generated using an identical circuit and substituting input signals phi1 and phi1b for phi2 and phi2b, respectively. The amplitude level expander 600 has an input 602 to receive input signal phi2 which swings between Vcc and ground as shown in FIG. 5. Referring to FIG. 6, on the positive edge of phi2, the base of npn transistor 604 attempts to go to Vcc due to the coupling action of capacitor 606. However, the base-emitter junction functions to limit the base voltage to 0.7 V. At this time, phi2b goes low turning on PMOS transistor 610 and pulling the output voltage phi2vm at output 614 to Vcc. Also at this time, PMOS transistor 618 is off, while NMOS transistor 612 is on and serves to keep NMOS transistor 608 off. On the negative edge of phi2, the base of npn transistor 604 goes negative to −(Vcc−0.7)V due to charge conservation by capacitor 606. Reservoir capacitor 616 is charged to −(Vcc−0.7)V and PMOS transistor 610 is off to ensure that negative charge is not removed from reservoir capacitor 616. At this time PMOS transistor 618 turns on which turns on NMOS transistor 608. Since the source of NMOS transistor 608 is at −(Vcc−0.7)V, phi2vm at output 614 will be driven to −(Vcc−0.7)V. If Vcc equals +5V as in typical automotive applications, phi2vm will swing between +5 V and −4.3 V as indicated in FIG. 5.

Scaling of the MOSFETs ensures that capacitor 616 is not discharged when phi2 is low. Therefore, PMOS transistor 618 is scaled to a length of 5 μm and a width of 26 μm, NMOS transistor is scaled to a length of 5 μm and a width of 11 μm, PMOS transistor 610 is scaled to a length of 5 μm and a width of 50 μm, and NMOS transistor 612 is scaled to length of 20 μm and a width of 6 μm. Therefore the signal conditioning unit 202 offers a true dual supply operation from a single voltage supply. This is more efficient and effective than the related art interface circuit 100 because the amplitude level expander 600 generates a lower negative voltage which does not vary greatly over temperature as opposed to the use of level shifting diodes which impair high temperature performance as the Vbe of the diodes decrease with proportionately with temperature.

Figure 8:
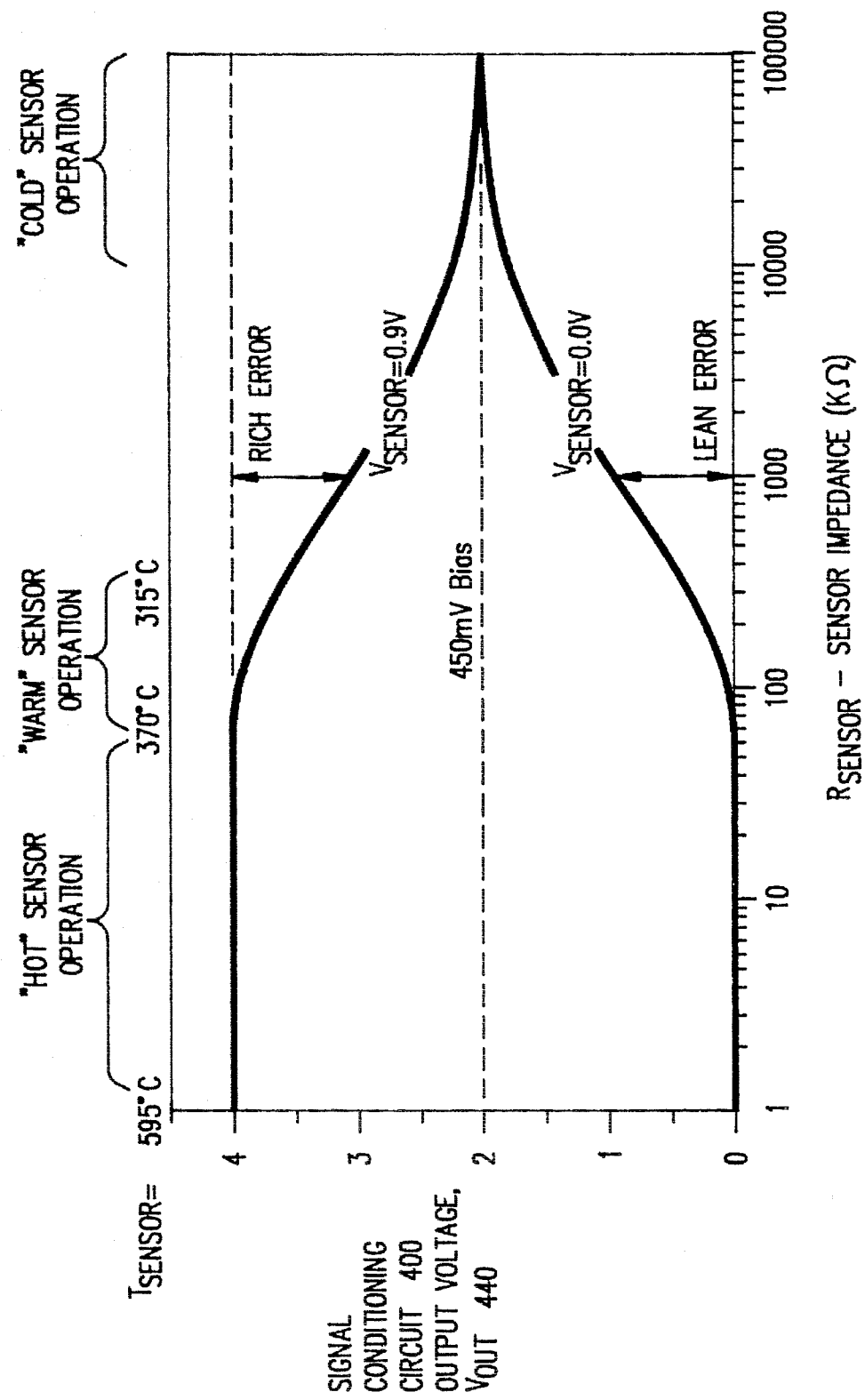
FIG. 8 is a graph illustrating the relationship between the output of a signal conditioning circuit and the resistance of an oxygen sensor unit.

FIG. 8 illustrates signal conditioning circuit 400 output voltage, Vout 440 versus the sensor impedance. The top portion of the graph provides temperature information for an oxygen sensor used in an automotive application. Note that as the sensor impedance increases, Vout 440 transitions to a nominal voltage of approximately 2.025 V.

Other embodiments, variations, and improvements not described herein are not necessarily excluded from the scope of the invention, which is defined by the following claims.

What is claimed is:

1. A signal conditioning circuit having terminals to receive clock generated control signals, comprising:

an amplifier having an input terminal and an output terminal;

an input impedor having a non-zero reactance, a first terminal coupled to the amplifier input terminal, and a second terminal;

an input circuit coupled to the input impedor second terminal and having first means responsive to a first clock generated control signal for switching the input impedor second terminal between first and second signal source input terminals;

a high impedance detection circuit including a detection impedor having a first terminal coupled to the input impedor second terminal and a second terminal; and a feedback circuit including a feedback impedor having a first terminal and a second terminal coupled across the amplifier input and output terminals, respectively.

2. A signal conditioning circuit as in claim 1, wherein the amplifier is an operational amplifier and the input impedor is a capacitor.

3. A signal conditioning circuit as in claim 1 further comprising:

a power supply coupled to the second terminal of the high impedance detection circuit to supply charge and a first reference potential thereto; and a signal source coupled across the first and second signal source input terminals, the signal source having a variable signal source voltage output to supply charge through a variable signal source impedance;

wherein when charge supplied by the signal source through the signal source impedance is small with respect to charge supplied by the power supply through the detection impedor, the amplifier output is proportional to the first reference potential and when the charge supplied by the signal source through the signal source is large with respect to the charge supplied by the power supply through the detection impedor, the amplifier output is proportional to the signal source voltage output.

4. A signal conditioning circuit as in claim 3 wherein the power supply supplies the first and a second reference potential to the signal conditioning circuit, and the first reference potential is +5 volts, the second reference potential is 0 volts, the first signal source input terminal is at a potential of −1.5 volts, and the second signal source input terminal is at a potential of −2 volts.

5. A signal conditioning circuit as in claim 1 further comprising:

a power supply supplying a first reference potential and a second reference potential;

a signal source coupled across the first and second signal source input terminals, respectively, the signal source having a variable signal source voltage output and a variable signal source impedance;

a second means responsive to a second clock generated control signal coupled between the input impedor first terminal and the amplifier input for switching the first terminal of the input impedor between the amplifier input terminal and a third reference potential; and third means responsive to a third clock generated control signal coupled between the detection impedor and the power supply for switching the second terminal of the detection impedor between the first and second reference potentials;

wherein during a first period the first and third switching means couple the input impedor second terminal to the first signal source input terminal and the first reference potential, respectively, and the second switching means couples the input impedor first terminal to the third reference potential causing the input impedor to store a first charge, and during a second period the first and third switching means couple the input impedor second terminal to the second signal source input terminal and the second reference potential, respectively, and the second switching means couples the input impedor first terminal to the amplifier input terminal causing the input impedor to store a second charge and causing the amplifier to transfer a charge equivalent to the difference between the first and second charges to the feedback impedor.

6. A signal conditioning circuit as in claim 5, further comprising a fourth means responsive to a fourth clock generated control signal for switching a second terminal of the feedback impedor to a fourth reference potential during the first period and to the amplifier output terminal during the second period.

7. A signal conditioning circuit as in claim 6, wherein the first and second periods repeat at a frequency of 100 kilohertz.

8. A signal conditioning circuit as in claim 6 further comprising an amplitude level expander circuit, wherein the first, third, and fourth switching means include two pairs of parallel coupled NMOS and PMOS transistors each with control terminals, the second switching means includes a pair of NMOS transistors, and the control terminals of the first switching means NMOS transistors are coupled to the amplitude level expander circuit and have a potential of −4.3 volts.

9. A signal conditioning circuit as in claim 1 further comprising:
  an oxygen sensor having an output terminal and a sensor reference potential terminal; and
  a fuel-air mixture control system having an input terminal;
wherein the oxygen sensor output terminal is coupled to the first signal source input terminal, the oxygen sensor reference potential terminal is coupled to the second signal source input terminal, and the fuel-air mixture control system input terminal is coupled to the amplifier output terminal.

10. A signal conditioning unit operating from a single power supply to condition a voltage signal received from a remote sensor, wherein the remote sensor voltage signal includes voltage values that lie within and below a first voltage to second voltage range of the power supply, comprising:
  a signal conditioning circuit including a NMOS switch having a current terminal coupled to a sensor input terminal to receive a voltage signal from the remote sensor and a control terminal;
  a clock generator to generate a clock signal CLK varying from a third voltage to a fourth voltage; and
  an amplitude level expander circuit including input terminals to receive CLK, a plurality of switches responsive to CLK, an energy storage device having first and second terminals, and an output terminal coupled to the NMOS switch control terminal, wherein when CLK has the third voltage, the energy storage device first terminal has the third voltage and the second terminal has about the second voltage and a first of the switches couples the output terminal to the first power supply voltage, and when CLK has the fourth voltage, the clock generator drives the energy storage device second terminal to a negative about third voltage and a second of the switches couples the output terminal to the negative about first voltage.

11. A signal conditioning unit as in claim 10, wherein the signal conditioning unit includes a second signal conditioning circuit.

12. A signal conditioning unit as in claim 10, wherein the clock generator generates a plurality of clock signals each derived from a single resistor.

13. A signal conditioning unit as in claim 12, wherein the resistor is located external to the signal conditioning unit.

14. A signal conditioning circuit, comprising:
  an amplifier;
  a feedback network coupled across an input terminal and output terminal of the amplifier;
  an input circuit having an output terminal and first and second sensor signal input terminals and including a plurality of switches to couple the first and second input terminals to the input circuit output terminal;
  an impedor having a non-zero reactance, a first terminal coupled to the input circuit output terminal, and a second terminal coupled to the amplifier input terminal, wherein the impedor and the feedback network contribute to a gain of the signal conditioning circuit; and
  a high impedance detection circuit, having first and second nominal signal input terminals, a detection impedor having a first terminal coupled to the impedor first terminal and a second terminal, and a plurality of switches to couple the first and second nominal signal input terminals to the detection impedor second terminal to alter the gain of the signal conditioning circuit when a high impedance exists between the first and second sensor signal input terminals of the input circuit relative to the detection impedor.

15. A signal conditioning circuit as in claim 14, wherein the amplifier is an operational amplifier.

16. A signal conditioning circuit as in claim 14, wherein the input circuit comprises:
  a first switch pair having a PMOS transistor coupled in parallel with a NMOS transistor and each transistor having a control terminal coupled to a first control signal and a second control signal, respectively, and an operable current path to electrically couple the first sensor signal input terminal to the input circuit output terminal in response to the first and second control signals, respectively;
  a second switch pair having a PMOS transistor coupled in parallel with a NMOS transistor and each transistor having a control terminal coupled to a third control signal and a fourth control signal, respectively, and an operable current path to electrically couple the second sensor signal input terminal to the input circuit output terminal in response to the third and fourth control signals, respectively;
wherein the first control signal is a periodic signal cycling from a first potential to a second potential, the second control signal is a complementary signal of the first control signal cycling from a third potential to the first potential, the third control signal is a complimentary signal of the first control signal cycling from the first potential to the second potential wherein the second potentials of the first and third control signals are non-overlapping, and the fourth control signal is a complimentary signal of the third control signal cycling from a first potential to the third potential.

17. A signal conditioning circuit as in claim 16, wherein the first potential is +5 volts, the second potential is 0 volts, and the third potential is −4.3 volts.

18. A signal conditioning circuit as in claim 16, wherein the high impedance detection circuit comprises:

a first switch pair having a PMOS transistor coupled in parallel with a NMOS transistor and each transistor having a control terminal coupled to the first control signal and a fifth control signal, respectively, and an operable current path to electrically couple the first nominal signal input terminal to the input circuit output terminal in response to the first and second control signals, respectively;

a second switch pair having a PMOS transistor coupled in parallel with a NMOS transistor and each transistor having a control terminal coupled to the third control signal and a sixth control signal, respectively, and an operable current path to electrically couple the second nominal signal input terminal to the input circuit output terminal in response to the third and sixth control signals, respectively;

wherein the fifth control signal is a complementary signal of the first control signal and the sixth control signal is a complimentary signal of the third.

19. A signal conditioning circuit as in claim 14, wherein the high impedance detection circuit comprises:

a first switch pair having a PMOS transistor coupled in parallel with a NMOS transistor and each transistor having a control terminal coupled to a first control signal and a second control signal, respectively, and an operable current path to electrically couple the first nominal signal input terminal to the input circuit output terminal in response to the first and second control signals, respectively;

a second switch pair having a PMOS transistor coupled in parallel with a NMOS transistor and each transistor having a control terminal coupled to a third control signal and a fourth control signal, respectively, and an operable current path to electrically couple the second nominal signal input terminal to the input circuit output terminal in response to the third and sixth control signals, respectively;

wherein the first control signal is a periodic signal cycling from a first potential to a second potential, the second control signal is a complementary signal of the first control signal, the third control signal is a complimentary signal of the first control signal cycling from the first potential to the second potential wherein the second potentials of the first and third control signals are non-overlapping, and the fourth control signal is a complimentary signal of the third control signal.

20. A signal conditioning circuit as in claim 14, further comprising an energy storage component coupled across the input terminal and output terminal of the amplifier.

21. A signal conditioning circuit as in claim 14 herein the impedors are capacitors.

22. A signal conditioning apparatus to provide an output corresponding to an input from a sensor, wherein the sensor includes a sensor signal source to provide a sensor signal to a sensor input and a sensor impedor coupled in series with the signal source, comprising:

an amplifier having an output and an input;
a clock generator;
a nominal signal generator;
first, second, third, and fourth reference terminals;
a first impedor having first and second terminals and a non-zero reactance;
a second impedor having a first terminal and further having a second terminal coupled to the first impedor first terminal;
a third impedor having a first terminal and further having a second terminal coupled to the first impedor second terminal;
a first switch circuit having a control terminal coupled to the clock generator, a common terminal coupled to the first impedor first terminal, a first switch terminal coupled to the sensor input, and a second switch terminal coupled to the first reference terminal;
a second switch circuit having a control terminal coupled to the clock generator, a first common coupled to the second impedor first terminal, a first switch terminal coupled to the second reference terminal, and a second switch terminal coupled to the nominal signal generator;
a third switch circuit having a control terminal coupled to the clock generator, a common terminal coupled to the third impedor first terminal, a first switch terminal coupled to the amplifier output, and a second switch terminal coupled to the third reference terminal; and
a fourth switch circuit having a control terminal coupled to the clock generator, a common terminal coupled to the first impedor second terminal, a first switch terminal coupled to the amplifier input, and a second switch terminal coupled to a fourth reference terminal.

23. The signal conditioning apparatus of claim 22, wherein the first, second, third, and fourth reference terminals have a potential of 0 volts.

24. The signal conditioning apparatus of claim 22, wherein:

the first and fourth switch circuits further include respective fourth terminals coupled to the clock generator; and the clock generator provides first, second, third, and fourth control signals, and a first bias signal to the first switch circuit, provides the first, the third, a fifth, and a sixth control signal to the second switch circuit, provides the third, the sixth, the first, and the fourth control signals to the third switch circuit, and provides the fifth and the sixth control signals and the first bias signal to the fourth switch circuit.

25. The signal conditioning apparatus of claim 24, wherein the first control signal is a periodic signal cycling from a first potential to a second potential, the second control signal a complementary signal of the first control signal cycling from a third potential to the first potential, the third control signal is a complementary signal of the first control signal cycling from the second potential to the first potential wherein the second potentials are non-overlapping, the fourth control signal is a complementary signal of the third control signal cycling from the second potential to the third potential, the fifth control signal is a complementary signal of the first signal cycling from the second potential to the first potential, the sixth control signal is a complementary signal of the third control signal cycling from the first potential to the second potential.

26. The signal conditioning apparatus of claim 25, further comprising:

a fifth reference terminal;
an amplitude level expander circuit to expand an amplitude of a clocked input signal cycling from a first potential to a second potential to an amplitude expanded signal cycling from the first potential to a third potential, comprising:
a fifth switch circuit having first control terminal coupled to the clock generator to receive the clocked input signal, a second control terminal to receive to receive a complemented first clocked input signal, a first reference terminal coupled to the nominal signal generator, and an output terminal;

an energy storage device having a first terminal and a second terminal coupled to the fifth switch first control terminal;

a first switch having a first switch terminal coupled to the second terminal of the energy storage device and a second terminal coupled to the fifth reference terminal.

27. A signal conditioning apparatus as in claim 22 wherein the first, second, and third impedors are capacitors.

28. A signal conditioning circuit to process an output signal from a sensor to provide a conditioned signal indicative of a property of a sensed event during normal sensor operation and a nominal indication during abnormal sensor operation, comprising:

a first charging means to charge a first impedor to a first charge level from a first voltage through a second impedor included in the sensor, the second impedor being responsive to the sensed event;

a second charging means to charge the first impedor to a second charge level primarily from a second voltage through a third impedor when the second impedor is greater than the third impedor;

a switching means to apply a third voltage to the first impedor to impose a third charge level on the first impedor resulting from the charging steps on the input of the amplifier; and an amplifying means having a fourth impedor in a feedback path of the amplifier to transfer a charge level difference between the third charge level and a previous charge level on the first impedor;

wherein the sensor output signal is conditioned.

29. A signal conditioning circuit as in claim 28 wherein the first, second, and third impedors are capacitors.

30. An electronic control board to process a sensor output signal from a sensor referenced to a sensor reference potential and provide a control signal to a control unit indicative of a property of a sensed event during normal sensor operation and provide nominal indication from a nominal first and second reference potentials during abnormal sensor operation, comprising:

an input impedor having first and second terminals and a non-zero reactance;

a first sampling means coupled to the input impedor and having input terminals to sample the sensor output signal and sensor reference potential and to transfer a sensor output representative charge to the first impedor during normal sensor operation;

a second sampling means coupled to the input impedor to sample the nominal first and second reference potentials and to transfer a nominal representative charge through a detection impedor to the first impedor during abnormal sensor operation, wherein during abnormal sensor operation an impedance between the first sampling means input terminals is high with respect to the detection impedor;

an amplifying means having a feedback path with a fourth impedor to modify an output signal of the amplifying means to transfer the sensor output representative charge to the fourth impedor during normal sensor operation and to transfer the nominal representative charge during abnormal sensor operation.

31. An electronic control board as in claim 30, wherein the output signal of the amplifying means is an analog signal, further comprising:

an analog to digital converter coupled to the amplifying means output to convert the amplifying means output signal to an equivalent digital signal; and a microcontroller means coupled to the amplifying means output to provide an electronic control signal to the control unit.

32. An electronic control board as in claim 31, wherein the control unit controls an internal combustion engine fuel-air mixture.

33. An electronic control board as in claim 30 wherein the input impedor and the detection impedor are capacitors.

34. A method of processing an output signal from a sensor to provide a conditioned signal indicative of a property of a sensed event during normal sensor operation and a nominal indication during abnormal sensor operation, comprising:

charging a first impedor from a first voltage through a second impedor included in the sensor, the second impedor being responsive to the sensed event;

charging the first impedor primarily from a second voltage through a third impedor when a quotient of the second voltage divided by an impedance of the third impedor is greater than a quotient of the first voltage divided by an impedance of the second impedor;

applying a third voltage to the first impedor to impose a charge on the first impedor resulting in an excess charge from the charging steps on the first impedor; and modifying an output signal of an amplifier, having an input coupled to the first impedor, to transfer the excess charge on the first impedor to a fourth impedor in a feedback path of the amplifier, wherein the output signal is conditioned.

35. A method of processing an output signal as in claim 34 wherein the first, second, and third impedors are capacitors.

36. A method of processing an output signal as in claim 34 wherein the first charging step includes coupling the first impedor through a first switch to a first sensor terminal having the first voltage, the first switch being responsive to a first signal derived from a clock generator; and wherein the step of applying a third voltage includes coupling the first impedor through a second switch to a second sensor terminal having the third voltage, the second switch being responsive to a second signal derived from the clock generator.

37. A method of processing an output signal as in claim 34 further comprising the step of:

discharging the fourth impedor during the first impedor charging step.

38. A circuit comprising:

an amplifier having an input terminal and an output terminal;

a feedback circuit having a first terminal coupled to the amplifier input terminal and a second terminal coupled to the amplifier output terminal;

a first capacitor having a first terminal coupled to the amplifier input terminal and having a second terminal for coupling to a first time varying voltage source; and a second capacitor having a first terminal coupled to the first capacitor second terminal and having a second terminal for coupling to a second time varying voltage source.

39. A circuit as in claim 38 further comprising a clock generator for providing a periodic clock signal; and a switching circuit coupled to the clock signal generator and responsive to the periodic clock signal, the switching circuit having a first terminal coupled to the amplifier input terminal, a second terminal coupled to a reference voltage, and a third terminal coupled to the first capacitor first terminal and alternately coupled to the first and second switching circuit terminals once during each clock signal period.

40. A circuit as in claim 38 wherein the feedback circuit comprises:

a capacitor having a first terminal and a second terminal;

a clock signal generator for providing a periodic clock signal; and a switching circuit coupled to the clock signal generator and responsive to the periodic clock signal, the switching circuit having a first terminal coupled to the amplifier output terminal, a second terminal coupled to a reference voltage, and a third terminal coupled to the capacitor first terminal and alternately coupled to the first and second switching circuit terminals once during each clock signal period.

41. A circuit as in claim 38 further comprising:

a clock generator for providing first and second periodic clock signals, wherein the first time varying voltage source includes a first switching circuit coupled to the clock signal generator and responsive to the first periodic clock signal, the first switching circuit having a first terminal coupled to a first voltage, a second terminal coupled to a first reference voltage, and a third terminal coupled to the first capacitor second terminal and alternately coupled to the first and second terminals of the first switching circuit once during each first clock signal period; and wherein the second time varying voltage source includes a second switching circuit coupled to the clock signal generator and responsive to the second periodic clock signal, the second switching circuit having a first terminal coupled to a second voltage, a second terminal coupled to a second reference voltage, and a third terminal coupled to the second capacitor second terminal and alternately coupled to the first and second terminals of the second switching circuit once during each second clock signal period.

* * * * *

UNITED STATES PATENT AND TRADEMARK OFFICE
CERTIFICATE OF CORRECTION

PATENT NO.      : 5,554,951
DATED           : September 10, 1996
INVENTOR(S)     : John J. Gough It is certified that error appears in the above-identified patent and that said Letters Patent is hereby corrected as shown below:

column 6, line 28, delete "316" and substitute --318--.

column 7, lines 24 and 31, delete "phil" and insert --phi1--.

column 13, lines 42 and 46, delete "complimentary" and insert --complementary--.

Signed and Sealed this

Second Day of June, 1998

Attest:

BRUCE LEHMAN

Attesting Officer         Commissioner of Patents and Trademarks